United States Patent [19]
Bellezza

[11] Patent Number: 5,723,351

[45] Date of Patent: *Mar. 3, 1998

[54] METHOD OF MAKING MATRIX OF EPROM MEMORY CELL WITH A TABLECLOTH STRUCTURE HAVING AN IMPROVED CAPACITATIVE RATIO

[75] Inventor: Orio Bellezza, Curno, Italy

[73] Assignee: SGS-Thomson Microelectronics S.r.l., Agrate Brianza, Italy

[*] Notice: The term of this patent shall not extend beyond the expiration date of Pat. No. 5,296,396.

[21] Appl. No.: 521,469

[22] Filed: Aug. 30, 1995

Related U.S. Application Data

[62] Division of Ser. No. 191,667, Feb. 4, 1994, Pat. No. 5,475,250, which is a continuation of Ser. No. 929,418, Aug. 14, 1992, Pat. No. 5,296,396, which is a division of Ser. No. 759,203, Sep. 11, 1991, Pat. No. 5,160,986, which is a continuation of Ser. No. 444,796, Dec. 1, 1989, abandoned.

[30] Foreign Application Priority Data

Dec. 5, 1988 [IT] Italy ................. 22848/88

[51] Int. Cl.⁶ ................................. H01L 21/8247
[52] U.S. Cl. ................. 437/43; 437/48; 437/984
[58] Field of Search ................. 437/43, 44, 48, 437/984

[56] References Cited

U.S. PATENT DOCUMENTS

| | | | |
|---|---|---|---|
| 4,253,106 | 2/1981 | Goldsmith et al. | 257/316 |
| 4,258,466 | 3/1981 | Kuo et al. | 437/43 |
| 4,295,265 | 10/1981 | Horiuchi et al. | 437/43 |
| 4,334,347 | 6/1982 | Goldsmith et al. | 437/43 |
| 4,387,447 | 6/1983 | Klass et al. | 365/203 |
| 4,405,995 | 9/1983 | Shirai et al. | 257/320 |
| 4,422,092 | 12/1983 | Guterman | 257/316 |
| 4,423,491 | 12/1983 | Tickle | 365/154 |
| 4,437,174 | 3/1984 | Masuoka | 365/182 |
| 4,490,900 | 1/1985 | Chiu | 257/321 |
| 4,500,899 | 2/1985 | Shirai et al. | 257/315 |
| 4,597,060 | 6/1986 | Mitchell et al. | 257/316 |
| 4,698,787 | 10/1987 | Mukherjee et al. | 365/185 |
| 4,734,887 | 3/1988 | Sugatani | 365/185 |
| 4,749,443 | 6/1988 | Mitchell et al. | 156/653 |
| 4,792,925 | 12/1988 | Corda et al. | 365/185 |
| 4,829,351 | 5/1989 | Engles et al. | 257/316 |
| 4,849,369 | 7/1989 | Jeuch et al. | 437/43 |
| 4,855,800 | 8/1989 | Esquivel et al. | 257/316 |
| 4,897,815 | 1/1990 | Tanaka et al. | 365/148 |
| 4,905,062 | 2/1990 | Esquivel et al. | 257/316 |
| 5,023,680 | 6/1991 | Gill et al. | 257/321 |
| 5,047,362 | 9/1991 | Bergemont | 437/52 |
| 5,110,753 | 5/1992 | Gill et al. | 437/52 |
| 5,120,571 | 6/1992 | Gill et al. | 437/51 |
| 5,200,350 | 4/1993 | Gill et al. | 437/48 |
| 5,296,396 | 3/1994 | Bellezza | 437/43 |

FOREIGN PATENT DOCUMENTS

| | | |
|---|---|---|
| 0189594 | 8/1986 | European Pat. Off. . |
| 3539234A1 | 11/1984 | Germany . |

*Primary Examiner*—Chandra Chaudhari
*Attorney, Agent, or Firm*—Wolf, Greenfield & Sacks, P.C.; James H. Morris

[57] ABSTRACT

The matrix of EPROM memory cells comprises on a semiconductor substrate lines of source and drain parallel and alternated one to another, floating gate areas interposed in a checkerboard pattern between said source and drain lines and control gate lines parallel to one another and perpendicular to said source and drain lines in a superimposed condition with intermediate dielectric and aligned with respect to said floating gate area. Field oxide areas are provided for, formed on the substrate between one and the other of said control gate lines and side fins of the floating gate areas and of the control gate lines superimposed over said field oxide areas.

19 Claims, 4 Drawing Sheets

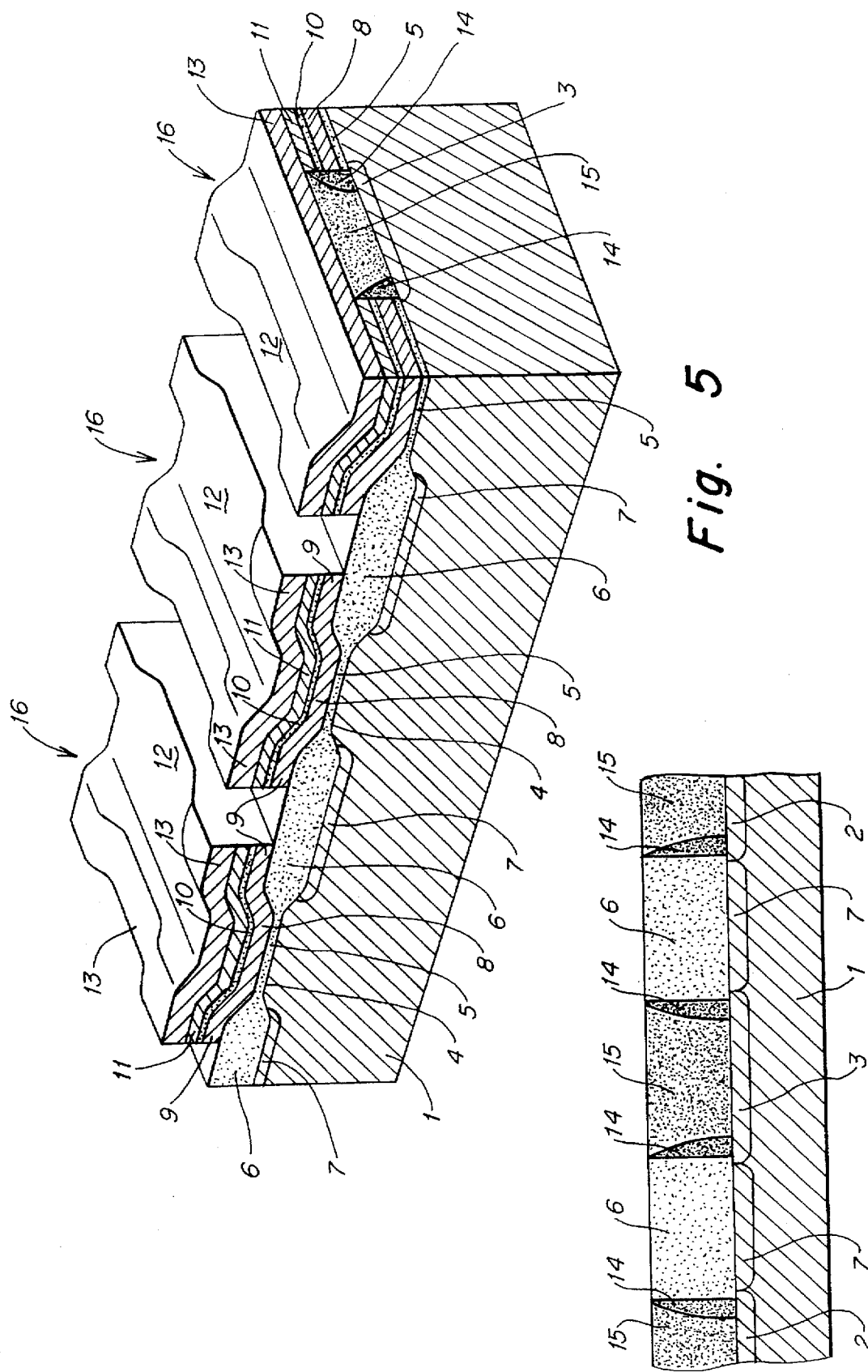

METHOD OF MAKING MATRIX OF EPROM MEMORY CELL WITH A TABLECLOTH STRUCTURE HAVING AN IMPROVED CAPACITATIVE RATIO

This is a divisional application Ser. No. 08/191,667, filed Feb. 4, 1994, now U.S. Pat. No. 5,475,250, which is a continuation of application Ser. No. 07/929,418, filed Aug. 14, 1992, now U.S. Pat. No. 5,296,396, which is a division of application Ser. No. 07/759,203, filed Sep. 11, 1991, now U.S. Pat. No. 5,160,986, which is a continuation of Ser. No. 07/444,796, filed Dec. 1, 1989, now abandoned.

BACKGROUND OF THE INVENTION

1.0. Field of the Invention

The present invention relates to a matrix of EPROM memory cells with a tablecloth structure having an improved capacitive ratio, together with a process for its manufacture.

2.0 Description of the Related Art Including Information Disclosed Under 37 C.F.R. §1.97–1.99

Matrices of EPROM memory cells are known having a so called "tablecloth" structure with source and drain lines parallel and alternate done to another on a semiconductor substrate, floating gate areas interposed in a checkerboard pattern between said source and drain lines and control gate lines parallel to one another and perpendicular to said source and drain lines in a superimposed condition with intermediate dielectric and aligned with respect to said floating gate areas.

The tablecloth structures have the favorable distinction of ensuring very high levels of integration (from 4 to 16 Mbit) maintaining topographical layout rules which are accessible with the current technology. Moreover, they allow the substantial reduction of the number of drain contacts in the matrix area (about ⅛th or ⅟₁₆th with respect to standard EPROM matrices) with appreciable benefits from the point of view of defectiveness.

Several tablecloths structures have so far been put forward, from the original one described in the U.S. Pat. No. 4,792,925 to the more recent one described in European Patent Application No. 0352830, both assigned to th present assignee.

The first of such structures provides for the non-usage of field oxide for matrix insulation. It is in fact possible, starting from a flat active area, to insulate from one another the cells and the source and drain lines (constituting the "bit lines") by means of insulation systems of the $P^+$ type, followed by the deposition of layers of dielectric materials and their subsequent planarization.

The greatest problem of this structure is represented by the low capacitive coupling between the control gate and the floating gate of each cell. In fact, the coupling area between the gates is practically identical to that between the floating gate and the substrate, so that, if similar thicknesses of oxide are used, the capacitive ratio is seen to assume a value near 0.5, that is lower than that of standard EPROM cells (normally between 0.6 and 0.7). This is too low a value for the cell to have good writing characteristics. Under these conditions the capacitive contribution due to the coupling of the floating gate towards the drain becomes heavier. The memory is consequently very sensitive to the so called drain turn-on phenomenon, a parasitic phenomenon which can lead to soft-erasure phenomena of non-selected cells and in any case to the worsening of the writing characteristics.

The second structure mentioned above provides for the presence, in various configurations, of islands of field oxide in the matrix area. This allows the attainment of larger capacitive couplings between the floating gate and the control gate but at the expense of a greater complexity of accomplishment (high number of masks) and/or of a lower degree of obtainable integration.

SUMMARY OF THE INVENTION

The object of the present invention is to accomplish a matrix of EPROM memory cells with a tablecloth structure, having an improved capacitive ratio without suffering from simultaneous drawbacks in terms of structural complexity or degree of integration.

According to the invention such object is attained with a matrix of EPROM memory cells, comprising a semiconductor substrate, source and drain lines which are parallel and alternated one to another on said substrate, floating gate areas interposed in a checkerboard pattern between said source and drain lines and control gate lines parallel to one another and perpendicular to said source and drain lines in a superimposed condition with intermediate dielectric and aligned with respect to said floating gate areas, characterized in that it comprises areas of field oxide formed on said substrate between one and the other of said control gate lines and side fins of said floating gate areas and of said control gate lines superimposed over said field oxide areas. Said field oxide areas are are aligned with the floating gate areas and said source and drain lines in a direction perpendicular to the control gate lines.

Put into other words, the present invention provides for areas of superimposition between the floating and the control gates and the areas of the field oxide, whereby it is possible to obtain a higher capacitive coupling between the two gates and thus an improved cell capacitive ratio. Furthermore, by the self-alignment of the field oxide with a floating gates and the source and drain areas, it is possible to maintain a good level of compactness, similar to that of the original tablecloth structure, and the degree of integration remains consequently high.

BRIEF DESCRIPTION OF THE DRAWINGS

A possible embodiment of the present invention is illustrated as a non-limiting example, together with the corresponding manufacturing process, in the enclosed drawings, wherein:

FIG. 4 shows said matrix portion in a cross-sectional view taken along the line IV—IV of FIG. 1;

FIG. 5 shows a perspective cross-sectional view taken along the plane of FIG. 2 of a row of memory cells included in the matrix portion of FIG. 1;

DESCRIPTION OF THE PREFERRED EMBODIMENTS

Figure 1:
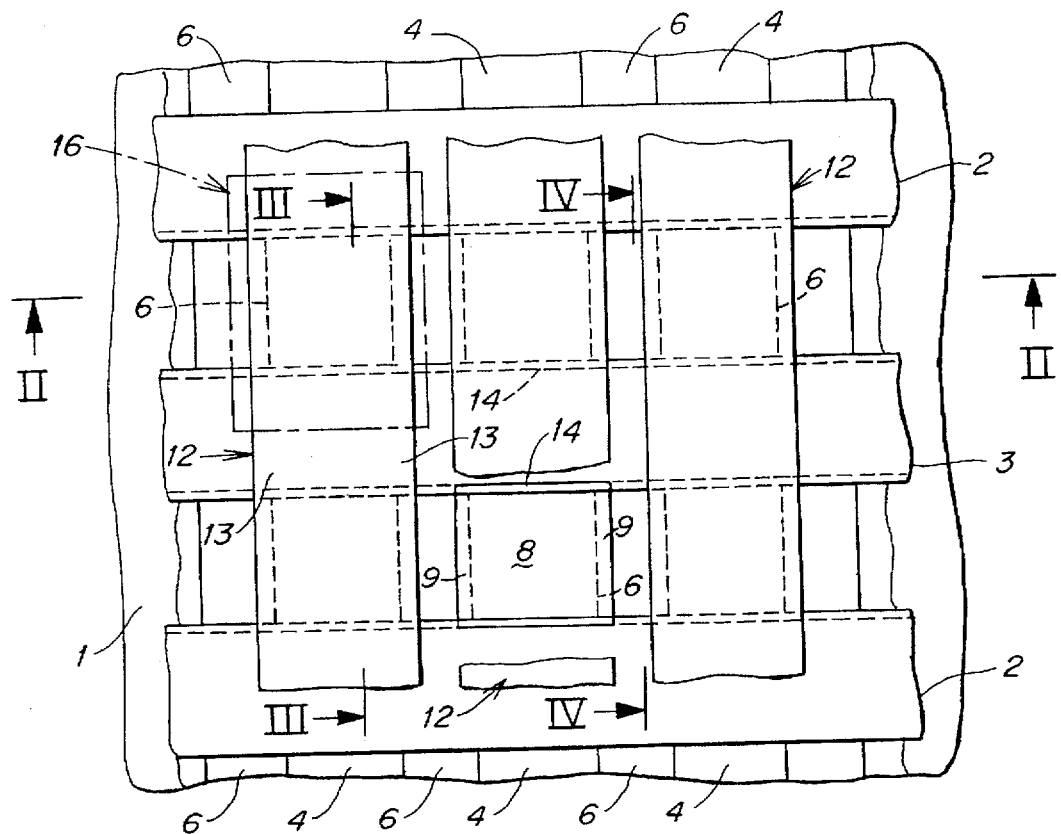
FIG. 1 shows a plan view of a portion of a matrix of EPROM memory cells with a tablecloth pattern according to the present invention.
Figure 2:
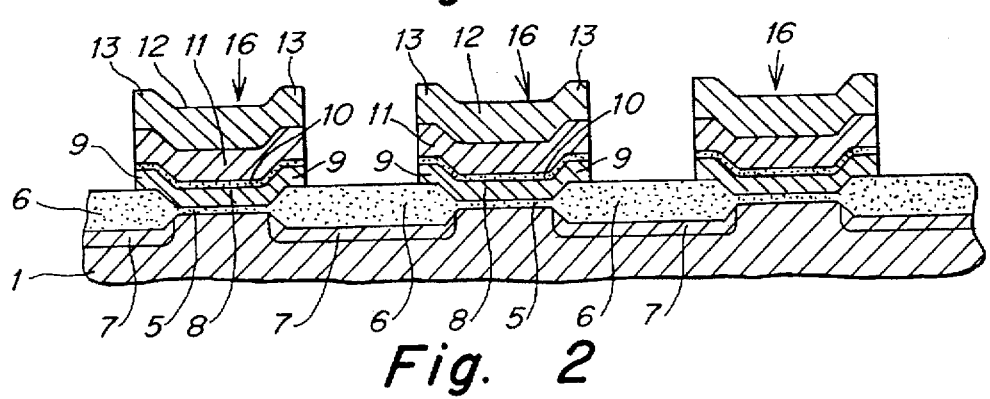
FIG. 2 shows said matrix portion in a cross-sectional view taken along the line II—II of FIG. 1.
Figure 3:
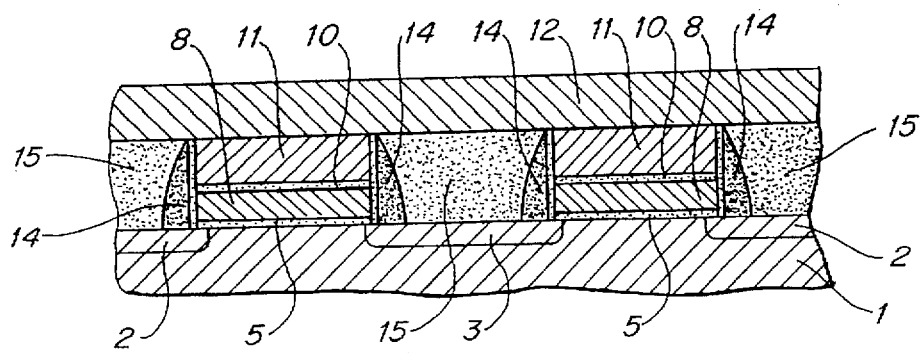
FIG. 3 shows said matrix portion in a cross-sectional view taken along the line III—III of FIG. 1.

The matrix of EPROM memory cells with a tablecloth pattern illustrated in FIGS. 1 to 5 comprises a semiconductor substrate 1, in particular of silicon, on whose surface there are obtained by diffusion of $N^+$ dopant parallel lines of source 2 and drain 3 alternated one to another (FIGS. 1, 3 and 4).

Between one and the other of said source and drain lines 2, 3 (constituting the so-called "bit-lines") there are defined active areas 4 coated with gate oxide 5, spaced with field oxide areas 6 superimposed over corresponding insulation diffusions 7 of the type $P^+$ of the substrate (FIGS. 1, 2 and 5).

Over the active areas 4 there are superimposed respective floating gate areas 8, say of polysilicon, having side fins 9 superimposed over corresponding side portions of the adjacent field oxide areas 6 (FIG. 2).

Over the floating gate areas 8 there are superimposed and aligned a layer of dielectric 10, a layer of polysilicon 11 acting as a barrier to planarization and lastly control gate lines (or word lines) 12, say of polysilicon or silicide or polycide, parallel to one another and perpendicular to the source and drain lines 2, 3 (FIGS. 1 and 3) and also provided with side fins 13 superimposed over the fins 9 of the floating gate areas 8 and thus over the field oxide areas 6.

As shown in FIGS. 3 and 5, on the sides of each set 9, 10, 11 there are formed on the source and drain lines 2, 3 two so called oxide "spacers" 14 and the remaining area over the same lines 2, 3 is coated with a dielectric layer (oxide which has been deposited or TEOS) 15, suitably planarized.

The matrix is thus comprised of a plurality of EPROM memory cells arranged in a tablecloth pattern, each of which is conformed in a manner similar to that indicated with 16 in FIGS. 1 and 2, that is, it has a floating gate area 8 interposed between two adjacent source 2 and drain 3 lines and a control gate line 12 perpendicular to the above lines 2 and 3, the two gates 12 and 8 having respective side fins 13 and 9 superimposed one over the other and over side portions of the field oxide areas 6.

Such superimposition, as can be seen from FIG. 5 as well, causes an increase in the capacitive coupling between the two gates (direct function of the area of reciprocal superimposition and inverse function of the thickness of the interposed dielectric) with respect to that between floating gate and substrate, which is subjected to the reducing effect of the presence of thick portions of field oxide. Consequently, the capacitive ratio increases as desired.

At the same time the structure remains as simple as that of the original tablecloth-pattern matrix and its degree of integration is correspondingly high.

An advantageous process for the manufacture of the tablecloth matrix of FIGS. 1 to 5 will now be described with reference to FIGS. 6 to 11.

Figure 6:
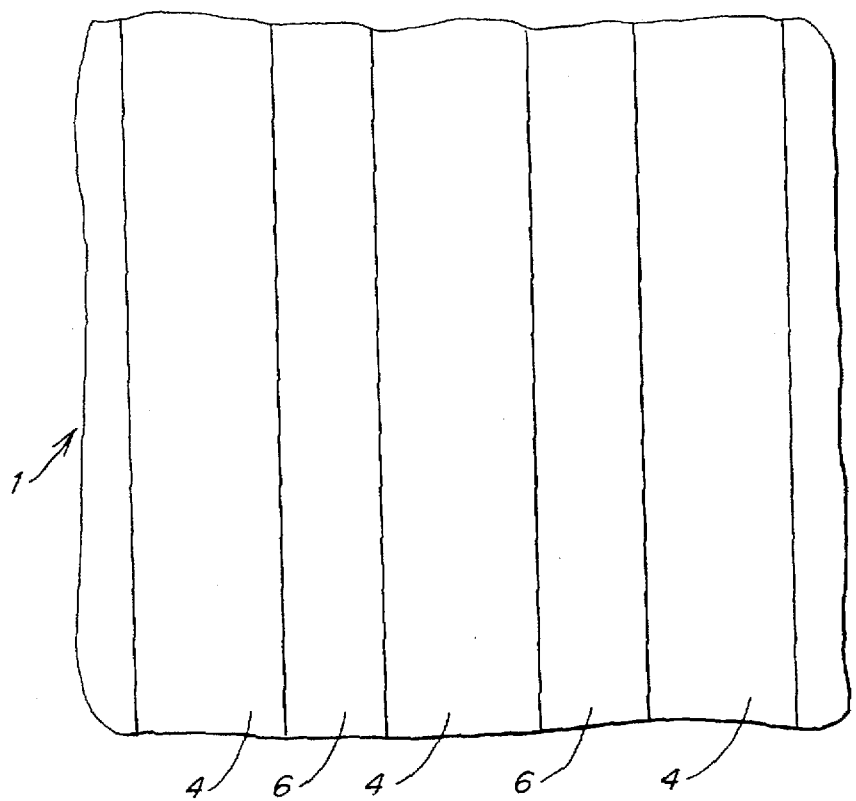
FIGS. 6 and 7 are plan views of the type of FIG. 1, which show some of the stages of the process according to the invention for the manufacture of a matrix of EPROM memory cells with a tablecloth pattern similar to that illustrated in FIGS. 1 to 5.

Over a silicon substrate 1 with a P-type doping there are defined with conventional techniques strips of active areas 4 alternated with parallel bars of field oxide 6 superimposed over corresponding insulation diffusions 7 of the type $P^+$, thus obtaining the structure illustrated in a plan view in FIG. 6. The thickness of the oxide bars 6 ranges preferably from 1000 to 5000 Å (Angstrom).

Over the entire surface there is then made to grow a layer of gate oxide 5, having thickness preferably ranging between 100 and 300 Å, on which there is then deposited a layer of polysilicon 8, preferably having a thickness ranging from 1000 to 3000 Å, to constitute the floating gate areas.

The layer of polysilicon 8 is subsequently subjected to an N-type doping and on it there is deposited or made to grow a dielectric layer 10 (oxide or O.N.O.), preferably having a thickness ranging from 100 to 300 Å, and there is then deposited a layer of polysilicon 11, acting as a barrier to planarization, preferably having a thickness ranging from 500 to 3000 Å.

Figure 7:
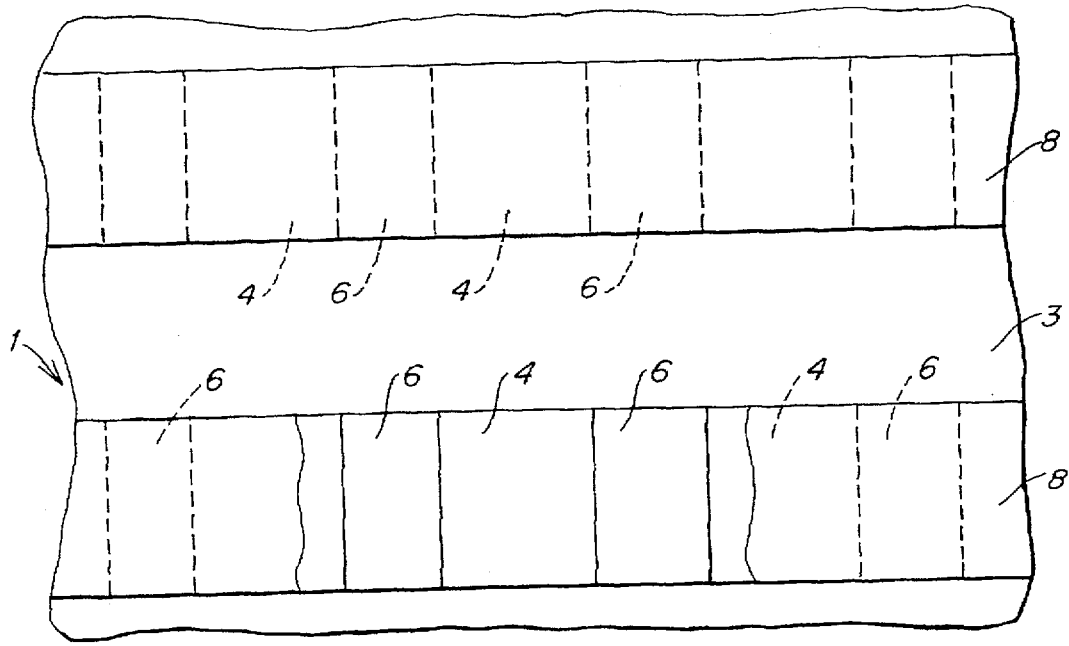
Figure 8:
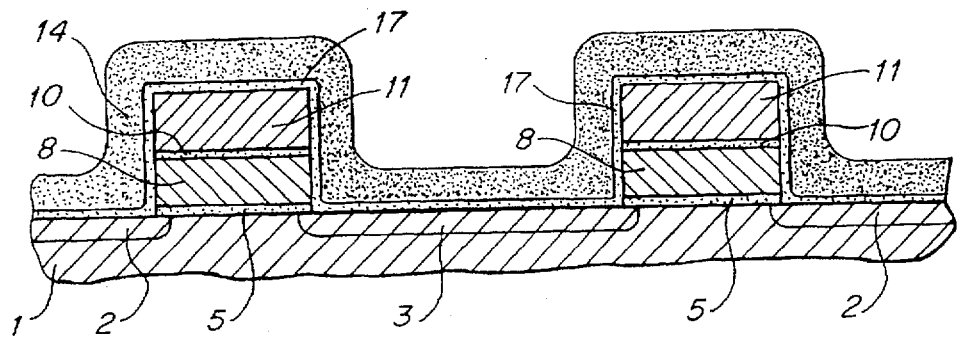
FIGS. 8 to 11 are cross-sectional views of the type of FIG. 3, which show further stages of the above process.

By means of lithographic definition with a first gate mask the anisotropic etching of the polysilicon barrier 11, of the dielectric 10 and of the polysilicon 8 is then carried out, as well as the self-aligned one of the field oxide 6, obtaining at last the structure shown in FIG. 7, where to the sides of floating gate strips 8 there are uncovered alternating strips of substrate 1, which, after growth of thermal oxide 17 (FIG. 8) closing the cells and suitable application of $N^+$-type dopant, are made to become source and drain lines 2 and 3.

Figure 9:
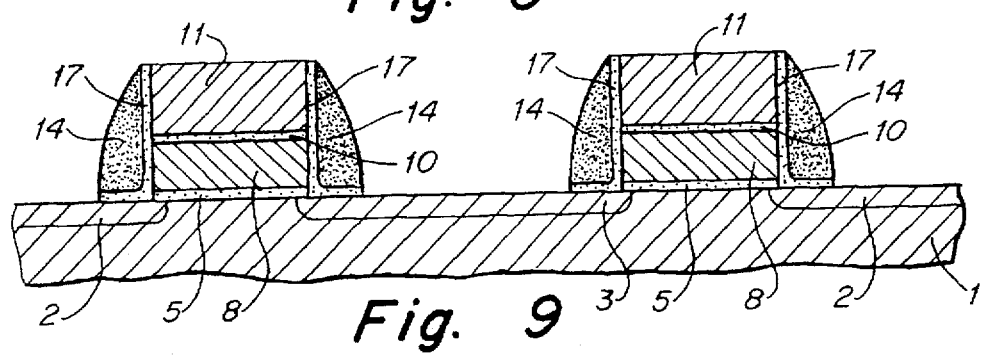
Figure 10:
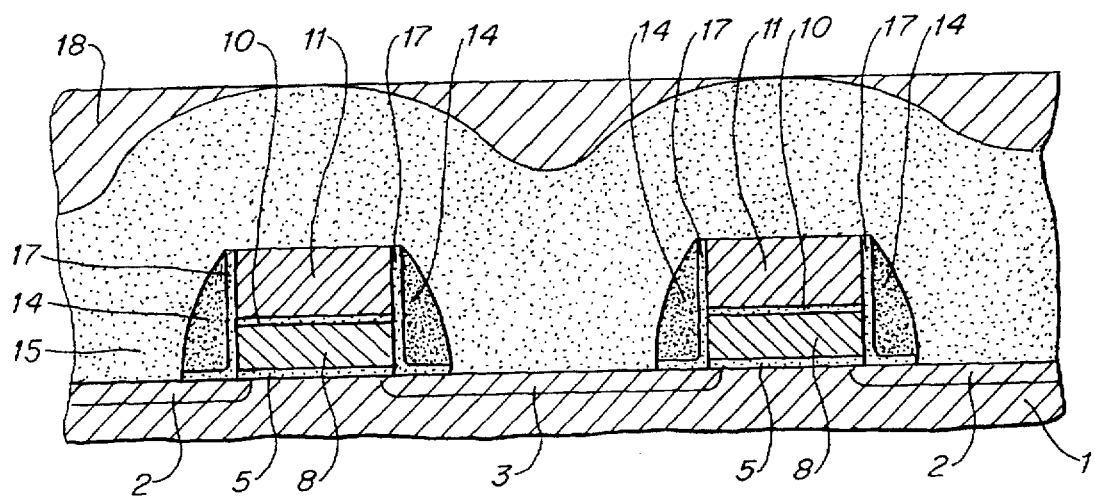
Figure 11:
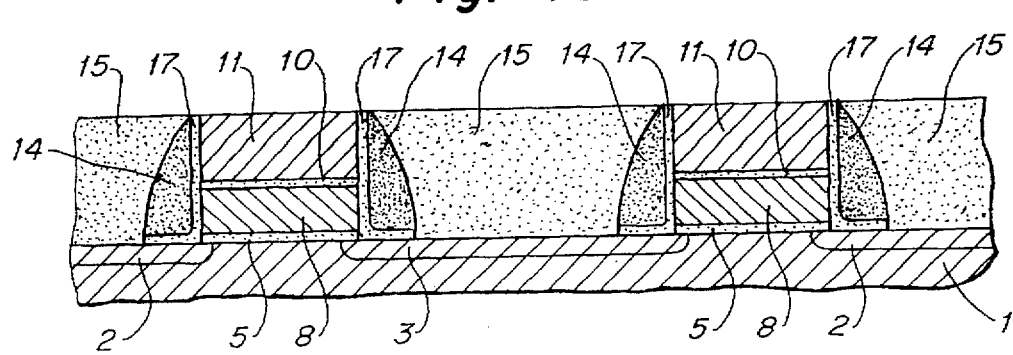

There follows the laying (FIG. 8) of a dielectric layer 14 (say, of oxide from TEOS), preferably having a thickness ranging from 1000 to 4000 Å, from which, by means of anisotropic etching, spacers are obtained located at the two sides of each cell (FIG. 9).

There is subsequently deposited a thick dielectric layer 15 (Say, of oxide from TEOS), preferably having a thickness ranging from 3000 to 6000 Å, and, by the application of planarizing material 18 (FIG. 10), the planarization of the dielectric layer 15 is executed until the layer of polysilicon barrier 11 (FIG. 11) is uncovered, using for this purpose any known planarization technique.

Lastly, the deposit is carded out of a layer of polysilicon or silicide or polycide (12), preferably having a thickness ranging from 2000 to 6000 Å, and by lithographic definition with a second gate mask, the etching of the upper layers 12 and 11 is executed and then the self-aligned one of the underlying layers 10 and 8 until it stops on the field oxide 6 and on the deposited dielectric 15. There is thus obtained the structure illustrated in FIGS. 1 to 5.

From this point on, all the most widely-different means for the accomplishment of the contact/final interconnection part may be adopted.

Naturally the described process may be subjected to many modifications without altering the nature of its essential spirit, which will later be summarized in the claims. In particular, the modifications may refer to the different oxidations, as well as to the accomplishment of the insulations and whatever else. For example, the spacers 14 may be missing.

An alternative process can, say, provide that, after the growth of gate oxide 5, the deposition be executed of the layer of floating gate 8 and then the self-aligned etching be carried out of floating gate 8 and of field oxide 6 and that after the formation of the source 2 and drain 3 lines the deposition and planarization be executed of the layer of thick dielectric material 15 over the source (2) and drain (3) lines and the deposition of the dielectric layer 10 and of the layer of polysilicide barrier (11).

This alternative process renders the planarization stage less critical, but, at the same time, the lateral diffusion of the source and drain application becomes more critical, as it is carried out before the heat treatment for the dielectric growth between the two gates.

I claim:

1. Process for the manufacture of a matrix of memory cells with source and drain lines parallel and alternated one to another on a semiconductor substrate, floating gate areas being interposed between said source and drain lines, and control gate lines parallel to one another and perpendicular to said source and drain lines in a superimposed condition with intermediate dielectric and aligned with respect to said floating gate areas, comprising the following succession of steps:

a) definition of strips of active areas alternated with parallel bars of field oxide on a semiconductor substrate;

b) growth of gate oxide;

c) deposition of a layer of floating gate, then of a dielectric layer and then of a barrier polysilicon layer;

d) self-aligned etching of the barrier layer, of the dielectric layer of the floating gate layer and of the field oxide bars in parallel strips which are perpendicular to said field oxide bars for the definition of uncovered strips of substrate to the sides of said parallel strips;

e) implantation of dopant in said uncovered strips for the formation of source and drain lines;

f) deposition and planarization of a layer of thick dielectric material over said source and drain lines;

g) deposition of a layer of control gate; and h) patterning and etching of said layer of control gate and of said parallel strips of floating gate, dielectric layer and barrier layer until it stops on said field oxide for the definition of memory cells with floating gate areas being interposed between said source and drain lines, and control gate lines parallel to one another and perpendicular to said source and drain lines.

2. Process for the manufacture of a matrix of memory cells with source and drain lines parallel and alternated one to another on a semiconductor substrate, floating gate areas being interposed between said source and drain lines, and control gate lines parallel to one another and perpendicular to said source and drain lines in a superimposed condition with intermediate dielectric and aligned with respect to said floating gate areas, comprising the following succession of steps:

a) definition of strips of active areas alternated with parallel bars of field oxide on a semiconductor substrate;

b) growth of gate oxide layer over an entire top surface of said semiconductor substrate;

c) deposition of a layer of floating gate;

d) self-aligned etching of the floating gate and of the field oxide in parallel strips which are perpendicular to said field oxide bars for the definition of uncovered strips of substrate to the sides of said parallel strips;

e) implantation of dopant in said uncovered strips for the formation of source and drain lines;

f) deposition and planarization of a layer of thick dielectric material over said source and drain lines;

g) deposition of a layer of dielectric and of a layer of barrier polysilicon;

h) deposition of a layer of control gate; and i) patterning and etching of said layer of control gate and of said parallel strips of floating gate, dielectric layer and barrier layer until it stops on said field oxide for the definition of memory cells with floating gate areas being interposed between said source and drain lines, and control gate lines parallel to one another and perpendicular to said source and drain lines.

3. The process of claim 1 wherein the step of forming a first plurality of gate layers forms the barrier layer with polysilicon.

4. The process of claim 1 wherein the step of forming a first plurality of gate layers forms the control gate layer with polysilicon, polycide or silicide.

5. The process of claim 2 wherein the step of forming a first plurality of gate layers forms the barrier layer with polysilicon.

6. The process of claim 2 wherein the step of forming a first plurality of gate layers forms the control gate layer with polysilicon, polycide or silicide.

7. Process for the manufacture of a matrix of memory cells comprising the following steps:

a) defining parallel areas of field oxide on a semiconductor substrate;

b) forming a first plurality of gate layers;

c) removing portions of the first plurality of gate layers and portions of the field oxide areas in a self-aligned manner such that parallel strips of substrate are exposed and further portions of the field oxide areas remain underneath the gate layers, the parallel strips being perpendicular to the parallel areas of field oxide;

d) forming source and drain areas in an alternating parallel pattern in the parallel strips of exposed substrate;

e) forming a control gate layer; and f) removing portions of the control gate layer and further portions of the first plurality of gate layers in a self-aligned manner to define memory cells with a floating gate areas interposed between each of the source areas, each of the drain areas, and each of the further portion of the field oxide areas.

8. The process of claim 7 further comprising the step of forming side spacers adjacent to opposing flanks of each of the floating gate areas and extending over portions of each of the source and drain areas, after the step of forming the source and drain areas.

9. The process of claim 8 further comprising the step of forming a second plurality of gate layers after the step of forming the side spacers, and wherein the step of removing portions of the control gate layer and further portions of the first plurality of gate layers in a self-aligned manner also removes portions of the second plurality of gate layers.

10. The process of claim 8 further comprising the step of planarizing the substrate surface, after the step of forming the side spacers.

11. The process of claim 10 further comprising the step of forming a second plurality of gate layers after the step of planarizing, and wherein the step of removing portions of the control gate layer and further portions of the first plurality of gate layers in a self-aligned manner also removes portions of the second plurality of gate layers.

12. The process of claim 7 further comprising the step of planarizing the substrate surface, after the step of forming the source and drain areas.

13. The process of claim 7 wherein the step of removing portions of the first plurality of gate layers and portions of the field oxide areas defines memory cells with side fins that extend over the field oxide areas.

14. The process of claim 7 further comprising the step of forming a second plurality of gate layers after the step of forming the source and drain areas and before the step of forming the control gate layer, and wherein the step of removing portions of the control gate layer and further portions of the first plurality of gate layers in a self-aligned manner also removes portions of the second plurality of gate layers.

15. The process of claim 14 wherein the step of forming a first plurality of gate layers forms a gate oxide layer and a floating gate layer.

16. The process of claim 15 wherein the step of forming a second plurality of gate layers forms a dielectric layer and a barrier layer.

17. The process of claim 7 wherein the step of forming a first plurality of gate layers forms a gate oxide layer, a floating gate layer, a dielectric layer, and a barrier layer.

18. The process of claim 17 wherein the step of forming a first plurality of gate layers forms the barrier layer with polysilicon.

19. The process of claim 17 wherein the step of forming a first plurality of gate layers forms the control gate layer with polysilicon, polycide or silicide.

* * * * *

UNITED STATES PATENT AND TRADEMARK OFFICE
CERTIFICATE OF CORRECTION

PATENT NO. : 5,723,351
DATED : March 3, 1998
INVENTOR(S) : Orio Bellezza

It is certified that error appears in the above-identified patent and that said Letters Patent is hereby corrected as shown below:

On the title page, item [54] and column 1, lines 1-4, should read:

[54] METHOD OF MAKING MATRIX OF EPROM MEMORY CELLS WITH A TABLECLOTH STRUCTURE HAVING AN IMPROVED CAPACITATIVE RATIO

In column 1, line 42 should read as follows:

Patent Application No. 0352830, both assigned to the present

In column 5, lines 53-64 should read as follows:

3. The process of claim 1 wherein step c forms the barrier layer with polysilicon.

4. The process of claim 1 wherein step g forms the control gate layer with polysilicon, polycide or silicide.

5. The process of claim 2 wherein step g forms the barrier layer with polysilicon.

6. The process of claim 2 wherein step h forms the control gate layer with polysilicon, polycide or silicide.

Signed and Sealed this

Nineteenth Day of May, 1998

Attest:

BRUCE LEHMAN

*Attesting Officer*  *Commissioner of Patents and Trademarks*